(12) United States Patent
Wada et al.

(10) Patent No.: US 10,267,470 B2
(45) Date of Patent: Apr. 23, 2019

(54) LIGHT EMITTING DEVICE

(71) Applicant: TOYODA GOSEI CO., LTD., Kiyosu-shi, Aichi-ken (JP)

(72) Inventors: Satoshi Wada, Kiyosu (JP); Koji Fukugawa, Kiyosu (JP)

( * ) Notice: Subject to any disclaimer, the term of this patent is extended or adjusted under 35 U.S.C. 154(b) by 0 days.

(21) Appl. No.: 15/997,021

(22) Filed: Jun. 4, 2018

(65) Prior Publication Data

US 2018/0372291 A1    Dec. 27, 2018

(30) Foreign Application Priority Data

Jun. 22, 2017 (JP) ................ 2017-122320

(51) Int. Cl.
| | | |
|---|---|---|
| *F21S 41/141* | (2018.01) | |
| *H01L 33/50* | (2010.01) | |
| *H01L 33/60* | (2010.01) | |

(52) U.S. Cl.
CPC ............ *F21S 41/141* (2018.01); *H01L 33/50* (2013.01); *H01L 33/60* (2013.01)

(58) Field of Classification Search
CPC ......... F21S 41/141; H01L 33/60; H01L 33/50
See application file for complete search history.

(56) References Cited

U.S. PATENT DOCUMENTS

| | | | |
|---|---|---|---|
| 8,465,188 B2 | 6/2013 | Sasaki et al. | |
| 9,761,773 B2 | 9/2017 | Miyoshi et al. | |
| 2010/0246186 A1* | 9/2010 | Chang ................. | F21V 7/0008 362/294 |
| 2011/0026266 A1 | 2/2011 | Sasaki et al. | |
| 2011/0291131 A1* | 12/2011 | Ito ......................... | H01L 33/54 257/93 |
| 2013/0329440 A1 | 12/2013 | Tsutsumi et al. | |
| 2016/0190392 A1* | 6/2016 | Kuraoka ................ | H01L 33/08 257/13 |
| 2016/0351620 A1* | 12/2016 | Tanaka ................... | H01L 33/50 |
| 2016/0372515 A1 | 12/2016 | Miyoshi et al. | |
| 2017/0084587 A1* | 3/2017 | Hung .................. | H01L 25/0753 |

FOREIGN PATENT DOCUMENTS

| | | |
|---|---|---|
| JP | 2009-266434 A | 11/2009 |
| JP | 2012-169189 A1 | 9/2012 |
| JP | 2017-11259 A | 1/2017 |

\* cited by examiner

*Primary Examiner* — Donald L Raleigh
(74) *Attorney, Agent, or Firm* — Posz Law Group, PLC

(57) ABSTRACT

A light emitting device includes plural light emitting elements, and plural plate-shaped wavelength conversion members that are arranged above the plural light emitting elements and separated from each other. At least a part of the plural wavelength conversion members is placed across above two or more light emitting elements of the plural light emitting elements. At least one of emission intensity of the plural light emitting elements and conversion efficiency of the plural wavelength conversion members is uneven.

8 Claims, 8 Drawing Sheets

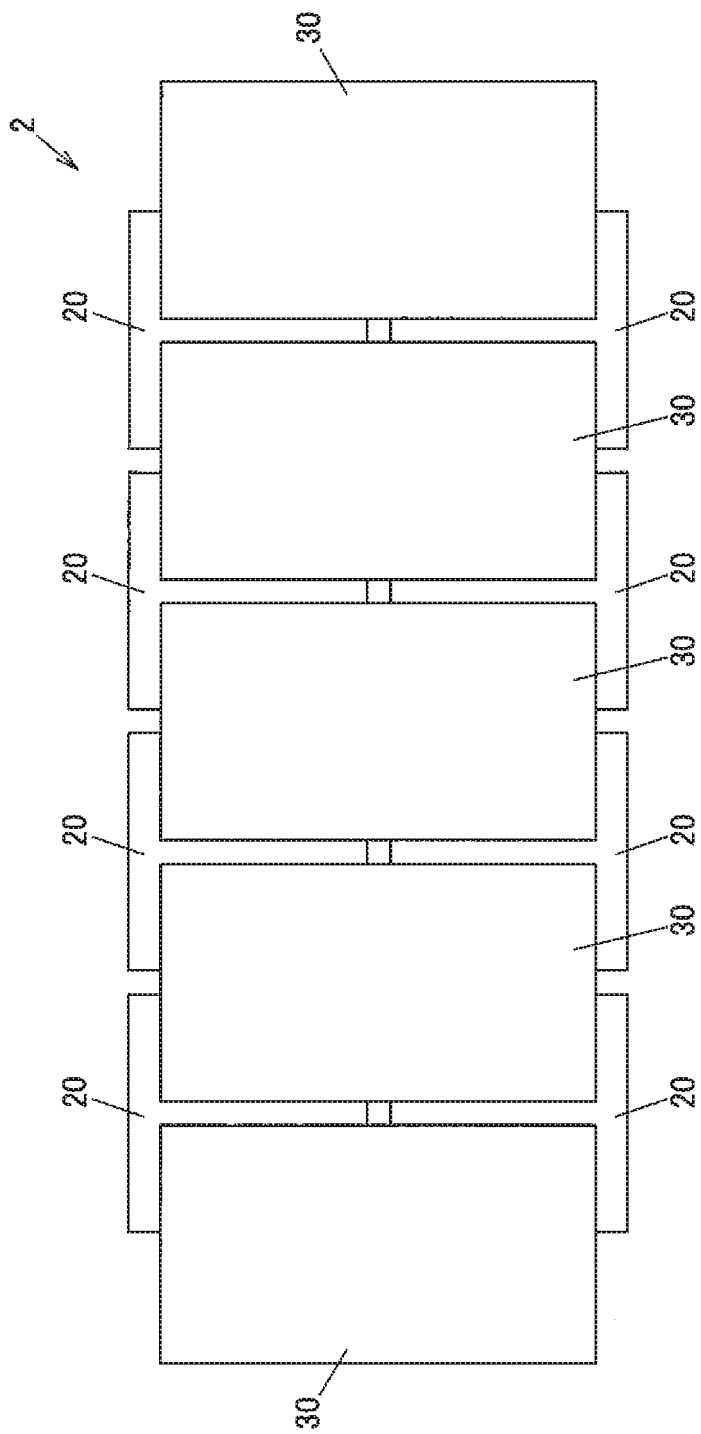

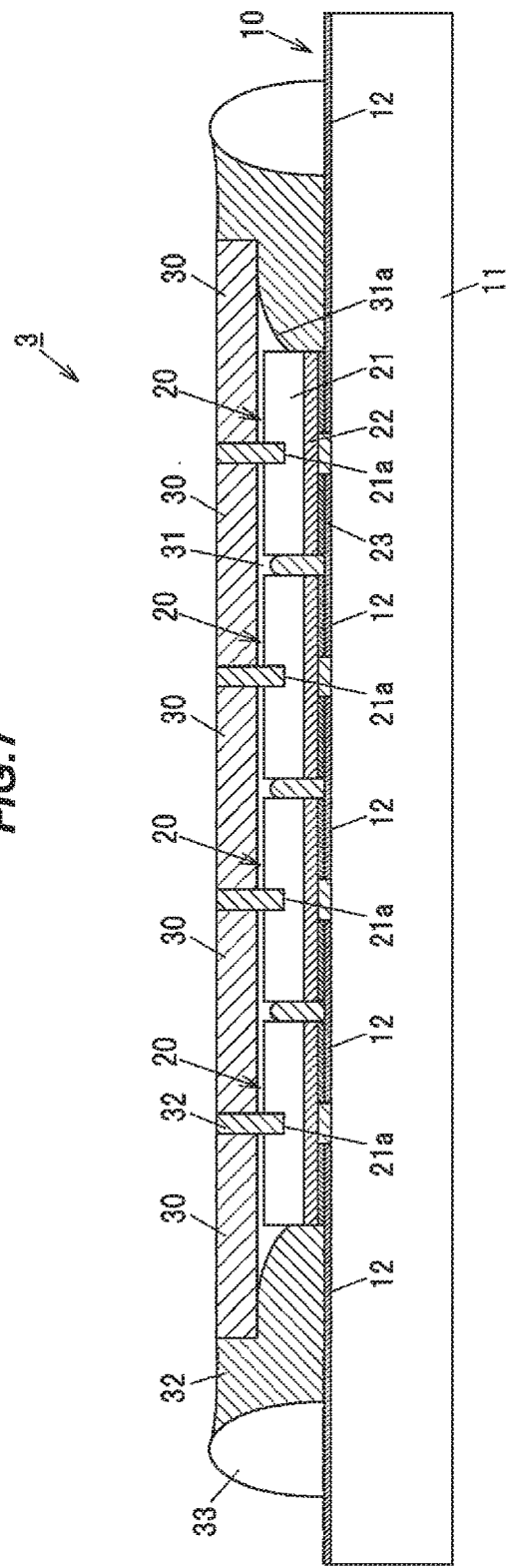

LIGHT EMITTING DEVICE

The present application is based on Japanese patent application No. 2017-122320 filed on Jun. 22, 2017, the entire contents of which are incorporated herein by reference.

BACKGROUND OF THE INVENTION

1. Field of the Invention

This invention relates to a light emitting device.

2. Description of the Related Art

A light emitting device is known that is provided with plural linearly arranged light emitting elements each having different emitting areas, wherein a light emitting element having a small emitting area is arranged at the center of the device (see e.g., JP 2017/011259 A and JP 2009/266434 A). According to the light emitting devices of JP 2017/011259 A and JP 2009/266434 A, a hot zone (i.e., the brightest area) can be formed at the center of its light distribution pattern since a current density is increased by reducing the emitting area of a light emitting element.

A light emitting device is known that is provided with plural matrix-arranged light emitting elements each having different light intensities, wherein a large light emitting element having a high light intensity is placed at the center of the device and small low-cost light emitting elements are placed therearound (see e.g., JP 2012/169189 A). According to the light emitting device of JP 2012/169189 A, the manufacturing cost thereof can be reduced while forming a hot zone at the center of its light distribution pattern.

SUMMARY OF THE INVENTION

In the light emitting devices of JP 2017/011259 A, JP 2009/266434 A and JP 2012/169189 A, the light distribution pattern of the light emitting elements may almost directly reflect the light distribution pattern of the light emitting device. Thus, if the number of the light emitting elements is odd, the hot zone can be formed at the center of the light distribution pattern of the light emitting device by arranging the light emitting element having the highest light intensity at the center of the device. However, if the number of the light emitting elements is even, plural light emitting elements have to be arranged at the center of the device and, therefore, the hot zone may shift from the center of the light distribution pattern of the light emitting device due to unevenness in light intensity of the light emitting elements.

It is an object of the invention to provide a light emitting device that reduces dependency on the light distribution pattern of light emitting elements to control a device light distribution pattern.

According to an embodiment of the invention, a light emitting device defined by [1] to [8] below is provided.

[1] A light emitting device, comprising:
plural light emitting elements; and
plural plate-shaped wavelength conversion members that are arranged above the plural light emitting elements and separated from each other,
wherein at least a part of the plural wavelength conversion members is placed across above two or more light emitting elements of the plural light emitting elements, and
wherein at least one of emission intensity of the plural light emitting elements and conversion efficiency of the plural wavelength conversion members is uneven.

[2] The light emitting device according to [1], wherein the plural light emitting elements are arranged in line,
wherein one of the plural wavelength conversion members is placed across two adjacent light emitting elements of the plural light emitting elements, and
wherein each of the plural wavelength conversion members is arranged above two or less light emitting elements of the plural light emitting elements.

[3] The light emitting device according to [2], wherein the number of the plural light emitting elements is even, and
wherein emission intensity of two central light emitting elements of the plural light emitting elements is higher than emission intensity of another light emitting element.

[4] The light emitting device according to [2] or [3], wherein the number of the plural light emitting elements is even, and
wherein conversion efficiency of a central wavelength conversion member of the plural wavelength conversion members is higher than conversion efficiency of another wavelength conversion member.

[5] The light emitting device according to [1], wherein the plural light emitting elements are arranged above lattice points of a quadrangle grid,
wherein one of the plural wavelength conversion members is placed across between four light emitting elements, of the plural light emitting elements, arranged above a unit lattice of a quadrangle grid, and
wherein the plural wavelength conversion members are each arranged above 4 or less light emitting elements of the plural light emitting elements.

[6] The light emitting device according to [5], wherein the number of the plural light emitting elements is even, and
wherein emission intensity of four central light emitting elements of the plural light emitting elements is higher than emission intensity of another light emitting elements.

[7] The light emitting device according to [5] or [6], wherein the number of the plural light emitting elements is even, and
wherein conversion efficiency of a central wavelength conversion member of the plural wavelength conversion members is higher than conversion efficiency of another wavelength conversion member.

[8] The light emitting device according to any one of [1] to [7], wherein the plural light emitting elements comprise a groove directly below a gap between the plural wavelength conversion members.

EFFECTS OF THE INVENTION

According to an embodiment of the invention, a light emitting device can be provided that reduces dependency on the light distribution pattern of light emitting elements to control a device light distribution pattern.

BRIEF DESCRIPTION OF THE DRAWINGS

Next, the present invention will be explained in conjunction with appended drawings, wherein:

FIG. 6 is a top view showing arrangements of the light emitting element and the wavelength conversion member of the light emitting device according to the second embodiment;

FIG. 7 is a cross sectional view showing the light emitting device according to the third embodiment;

DETAILED DESCRIPTION OF THE PREFERRED EMBODIMENTS (First Embodiment)

Figure 1:
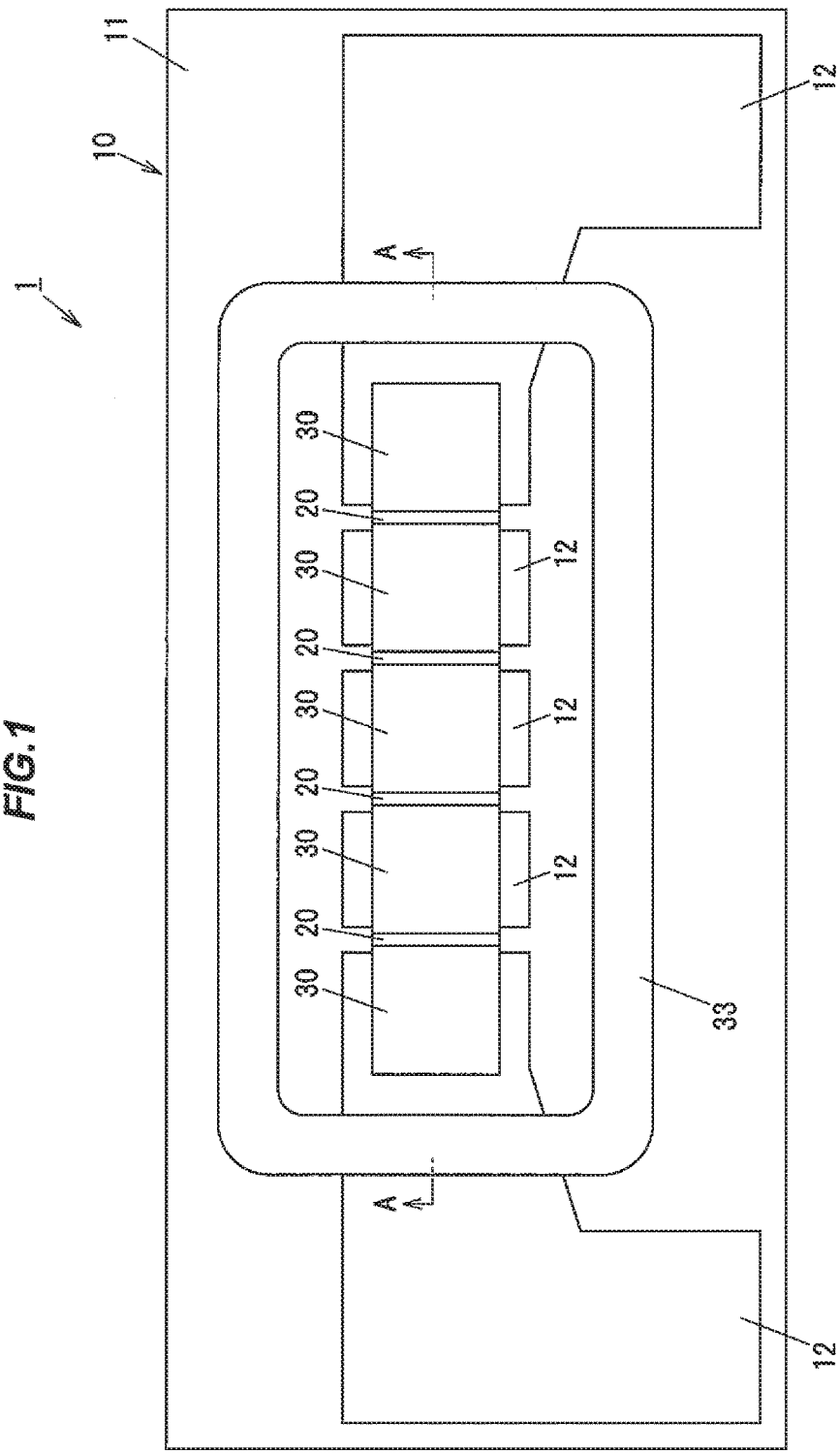
FIG. 1 is a top view showing a light emitting device according to the first embodiment.
Figure 2:
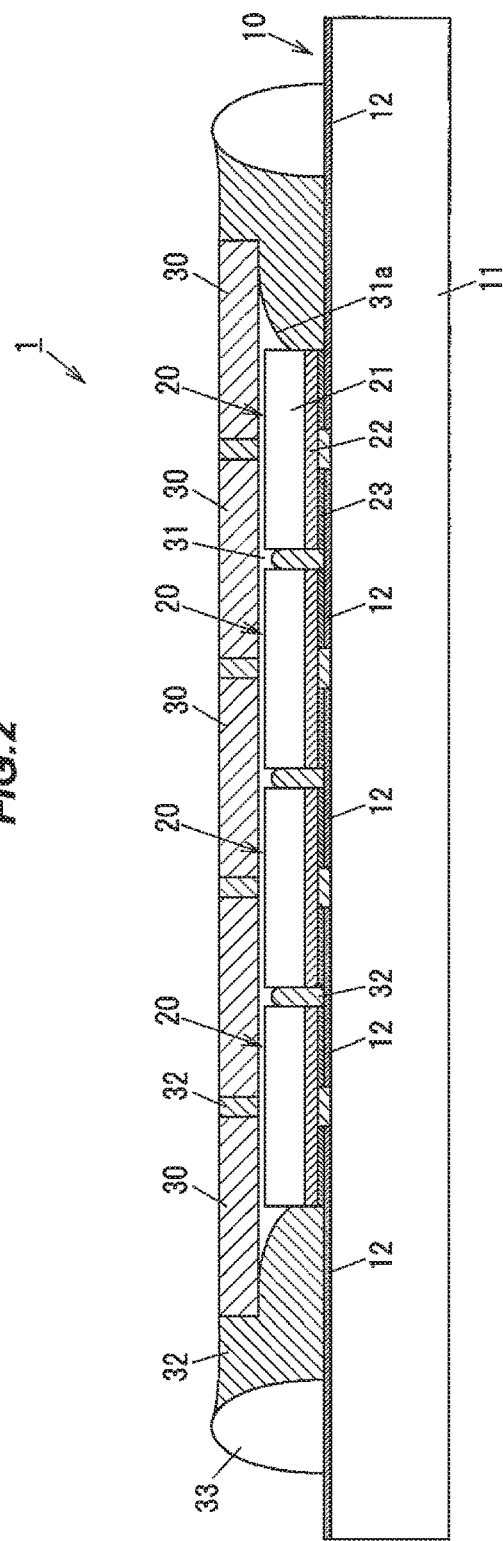
FIG. 2 is a cross sectional view showing the light emitting device cut along the line A-A in FIG. 1.

FIG. 1 is a top view showing a light emitting device 1 according to the first embodiment. FIG. 2 is a cross sectional view showing the light emitting device 1 cut along the line A-A in FIG. 1. In FIG. 1, illustration of a reflective material 32 described below will be omitted.

The light emitting device 1 is provided with a wiring substrate 10 on which wiring 12 is provided on a surface of the substrate 11, plural light emitting elements 20 that is face-down mounted on the wiring substrate 10, plural plate-shaped wavelength conversion members 30 that is arranged above the plural light emitting elements 20 while separated from each other, and a reflective material 32 that covers side surfaces of the wavelength conversion member 30 and the light emitting element 20.

Since the light emitting device 1 forms a hot zone in a light distribution pattern, at least one of emission intensity of the plural light emitting elements 20 or conversion efficiency of the plural the wavelength conversion members 30 is uneven.

For example, the light emitting element 20 is a flip-chip type LED chip provided with an element substrate 21, a light emitting functional layer 22 including an emission layer and clad layers that sandwiches the emission layer, and an element electrode 23 connected to the light emitting functional layer 22. The light emitting element 20 may be a light emitting element such as a laser diode except the LED chip. The number of the light emitting element 20 included in the light emitting device 1 is not limited.

Since the light emitting element 20 is face-down mounted, the element substrate 21 faces upward (an opposite side of the wiring substrate 10). The element electrode 23 on the light emitting element 20 is connected to the wiring 12 on the wiring substrate 10.

For example, the substrate 11 is ceramic substrates such as $Al_2O_3$ substrate and AlN substrate, metallic substrates such as Al substrate and Cu substrate, of which the surface are covered with insulated coating, or a glass epoxy substrate. The wiring 12 is composed of conductive materials such as Cu.

The wavelength conversion member 30 is a plate member including phosphor. For example, the wavelength conversion member 30 is a member in which phosphor particles are distributed in resin or ceramic. Type or color of the phosphor included in the wavelength conversion member 30 is not limited thereto. The light emitting element 20 works as an exciting light source for the phosphor included in the wavelength conversion member 30. A mixture color of an emission color of the light emitting element 20 and an emission color of the wavelength conversion member 30 is an emission color of the light emitting device 1. For example, when the emission color of the light emitting element 20 is blue and the emission color of the wavelength conversion member 30 is yellow, the emission color of the light emitting device 1 is white.

Since the wavelength conversion members 30 are arranged so as to be separated from each other, light emitted from the side surface of the wavelength conversion member 30 is reflected by the reflective material when the reflective material 32 is filled in a space between both wavelength conversion members 30, and light is reflected at an interface between the side surface of the wavelength conversion member 30 and air when the reflective material 32 is not filled in the space. Thus, the light emitted from each wavelength conversion member 30 hardly enters into the other wavelength conversion member 30.

The wavelength conversion member 30 is fixed on the light emitting element 20 by an adhesive 31. As shown in FIG. 2, when the outermost wavelength conversion member 30 protrudes outside from above the light emitting element 20, the adhesive 31 under the protruded portion has fillet geometry. Light emitted in a horizontal direction from a fillet geometry portion 31a of the adhesive 31 is reflected upward by an inclined surface of the fillet geometry portion 31a. Thus, light extraction efficiency increases.

For example, the reflective material 32 is composed of resins such as silicone resin including reflective filler and epoxy resin. When the reflective material 32 composed of resin is formed by potting, it is preferable to form dam 33 surrounding the light emitting element 20 and fill the reflective material 32 into an inside of the dam 33.

The reflective material 32 may be a reflective material that is composed of transparent resin including no reflective filler and reflects light at the interface caused by refractive index difference. In such case, Light entered into the reflective material 32 between adjacent light emitting elements 20 can be easily extracted upward by increasing a refractive index of the adhesive 31 higher than a refractive index of the reflective material 32. Thus, it can be intended to increase brightness and reduce color unevenness.

In the embodiment, plural light emitting elements 20 are arranged in line. One wavelength conversion member 30 is placed across the two adjacent light emitting elements 20 of the plural light emitting elements 20. Each of the wavelength conversion members 30 is arranged above the two or less light emitting elements 20. In other words, none of the wavelength conversion members 30 is placed across the three or more light emitting elements 20.

Figure 3A:
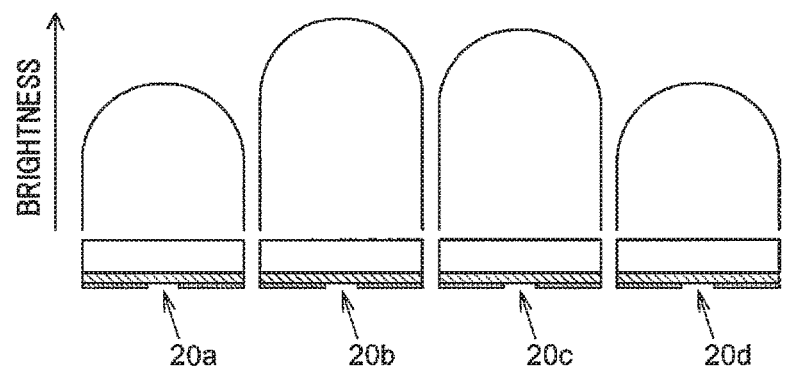
FIG. 3A is a schematic diagram showing a light distribution pattern of the light emitting element.
Figure 3B:
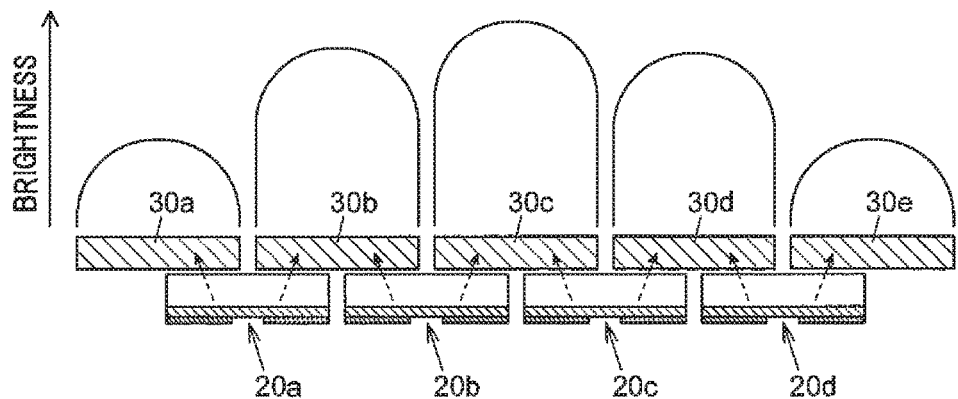
FIG. 3B is a schematic diagram showing a light distribution pattern of a light emitting device of which a wavelength conversion member is arranged on the light emitting element.

FIG. 3A is a schematic diagram showing a light distribution pattern of the light emitting element 20. FIG. 3B is a schematic diagram showing a light distribution pattern of the light emitting device 1 of which the wavelength conversion member 30 is arranged above the light emitting element 20;

In the examples shown in FIGS. 3A, 3B, the emission intensity of the two central light emitting elements 20b, 20c of the four light emitting elements 20 (20a to 20d) arranged in line is assumed to be higher than the emission intensity of the light emitting elements 20a, 20d at both sides thereof. Also, the emission intensity of the light emitting elements 20b, 20c is assumed to be a little dispersed. Also, the conversion efficiency of the five wavelength conversion members 30 (30a to 30e) is assumed to be uniform.

As shown in FIGS. 3A, 3B, the light distribution pattern of the light emitting device 1 is different from the light distribution pattern of the light emitting elements 20. This is because, if at least a part of the plural wavelength conversion members 30 is placed across above the two or more light emitting elements 20 of the plural light emitting elements 20, lights emitted from the two or more light emitting elements crossed by the wavelength conversion member 30 are mixed in the wavelength conversion member 30 placed across them and then outputted while being averaged or uniformed in distribution.

Thus, according to the light emitting device 1, the light distribution pattern can be controlled in accordance with size, number, and arrangement etc., of the wavelength conversion member 30 without depending on the light distribution pattern of the light emitting element 20.

For example, in the example shown in FIG. 3A, since the number of light emitting elements 20 is even, the two light emitting elements 20b, 20c are located in the center. Thus, if the emission intensity of the light emitting elements 20b and 20c are equal to each other, a hot zone is to be formed at a halfway point, i.e. at the center, of the light emitting elements 20b, 20c. However, the hot zone shifts to the side of the light emitting element 20b, which has a higher emission intensity, from the center of the light distribution pattern since the emission intensity of the light emitting elements 20b, 20c is uneven in the example shown in FIG. 3A.

By contrast, as shown in FIG. 3B, the hot zone is formed at the center, i.e., the center of the light distribution pattern, of the wavelength conversion member 30c since lights emitted from the light emitting elements 20b, 20c are averaged in the wavelength conversion member 30c placed across the light emitting elements 20b, 20c.

Meanwhile, the light distribution pattern shown in FIG. 3B can be obtained even if the emission intensity of the light emitting elements 20a to 20d is even and the conversion efficiency of the wavelength conversion member 30 is uneven, specifically, even if the central wavelength conversion member 30c has the highest conversion efficiency.

Also, the light distribution pattern shown in FIG. 3B can be obtained even if both of the emission intensity of the light emitting elements 20a to 20d and the conversion efficiency of the wavelength conversion member 30 are uneven, specifically, even if the emission intensity of the light emitting elements 20b, 20c is higher than the emission intensity of the light emitting elements 20a, 20d and the wavelength conversion member 30c has the highest conversion efficiency.

By shifting the position of the wavelength conversion member 30 above the light emitting element 20 in the horizontal direction, the light distribution pattern of the light emitting device 1 can be shifted without changing the position of the light emitting elements 20.

Figure 4A:
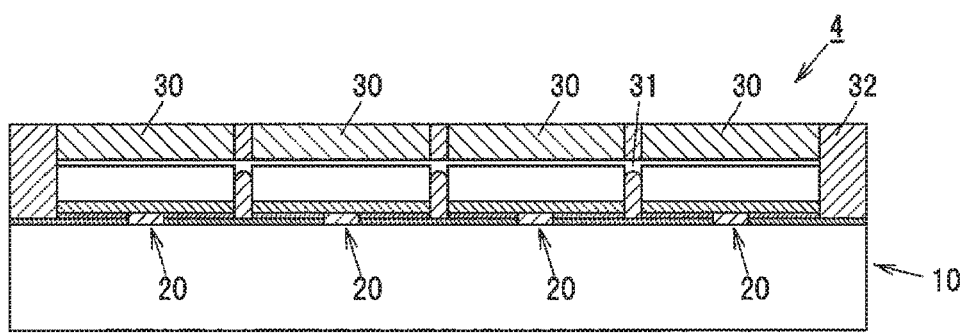
FIG. 4A is a cross sectional showing a light emitting device as the comparative example.
Figure 4B:
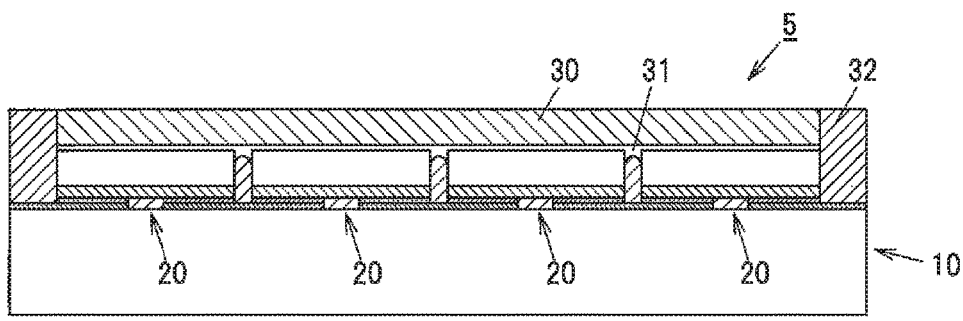
FIG. 4B is a cross sectional view showing a light emitting device as the comparative example.

FIGS. 4A and 4B are cross sectional views showing light emitting devices 4 and 5 as comparative examples. Each wavelength conversion member 30 is placed above each light emitting element 20 in the light emitting device 4 shown in FIG. 4A. In this case, since light emitted from each light emitting element 20 is extracted through only the wavelength conversion member 30 placed above the light emitting element 20, the light distributing pattern of the light emitting element 20 almost directly reflects the light distribution pattern of the light emitting device 4.

In the light emitting device 5 shown in FIG. 4B, only one wavelength conversion member 30 is placed so as to cover all of the light emitting elements 20. In this case, light emitted from the light emitting element 20 partially travels in an in-plane direction in the wavelength conversion member 30. Thus, although the light distribution pattern of the light emitting device 5 is gentler than the light distribution pattern of the light emitting element 20, the peak positon is substantially unchanged.

According to the light emitting devices 4, 5 thus constructed, e.g., if the number of the light emitting elements 20 is even, the hot zone fails to be formed in the center of the light distribution pattern due to unevenness in emission intensity of the light emitting elements 20.

FIGS. 5A to 5D are cross sectional views showing light emitting devices 1a to 1d, respectively, as variations of the light emitting device 1 of the first embodiment.

Figure 5A:
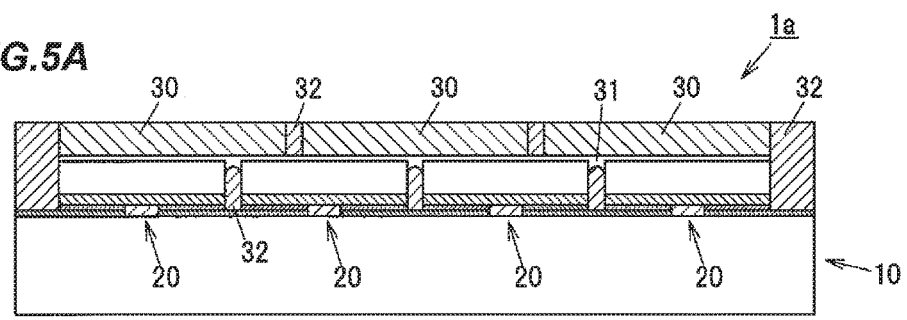
FIG. 5A is a cross sectional view showing a variation of the light emitting device according to the first embodiment.

The light emitting device 1a shown in FIG. 5A is a variation to show that relation between the number of the wavelength conversion members 30 and the number of the light emitting elements 20 is not specifically limited. In the light emitting device 1a, the number of the wavelength conversion members 30 is less than the number of the light emitting elements 20.

In the light emitting device 1a, each of the wavelength conversion members 30 separated from each other is placed across the two light emitting elements 20 such that lights emitted from the two light emitting elements 20 are mixed in each of the wavelength conversion members 30. Thus, the light distribution pattern of the light emitting device 1a can be different from the light distribution pattern of the light emitting elements 20.

Figure 5B:
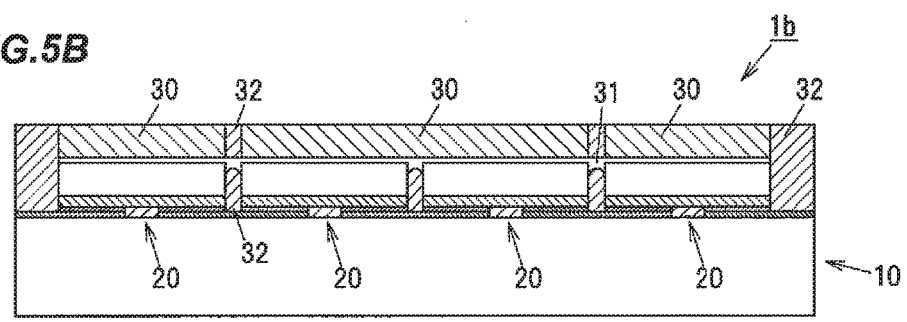
FIG. 5B is a cross sectional view showing a variation of the light emitting device according to the first embodiment.

The light emitting device 1b shown in FIG. 5B is constructed such that only a part of the wavelength conversion members 30 is placed across the two or more light emitting elements 20. In the light emitting device 1b, only the central wavelength conversion member 30 of the three wavelength conversion members 30 is placed across the two light emitting elements 20. However, the wavelength conversion members 30 at both ends thereof are not placed across the plural light emitting elements 20.

In the light emitting device 1b, since lights emitted from the two light emitting elements 20 are mixed in the central wavelength conversion member 30, the light distribution pattern of the light emitting device 1b can be different from the light distribution pattern of the light emitting elements 20.

Figure 5C:
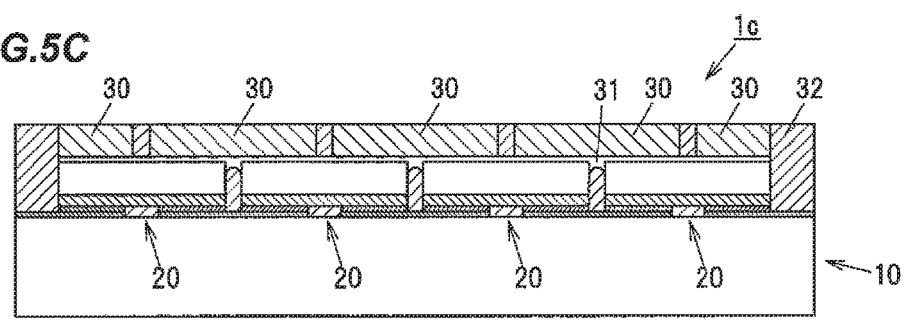
FIG. 5C is a cross sectional view showing a variation of the light emitting device according to the first embodiment.

The light emitting device 1c shown in FIG. 5C is constructed such that the outermost wavelength conversion member 30 does not extend outside from directly above the light emitting element 20. The outermost wavelength conversion members 30 have a width narrower than the central three wavelength conversion members 30 along the alignment direction (i.e., right and left directions in FIG. 5C) of the light emitting elements 20.

The light distribution pattern near the center of the light emitting device 1c is nearly the same as the light distribution pattern near the center of the light emitting device 1. The light distribution pattern of the light emitting device 1c can be different from the light distribution pattern of the light emitting elements 20.

Figure 5D:
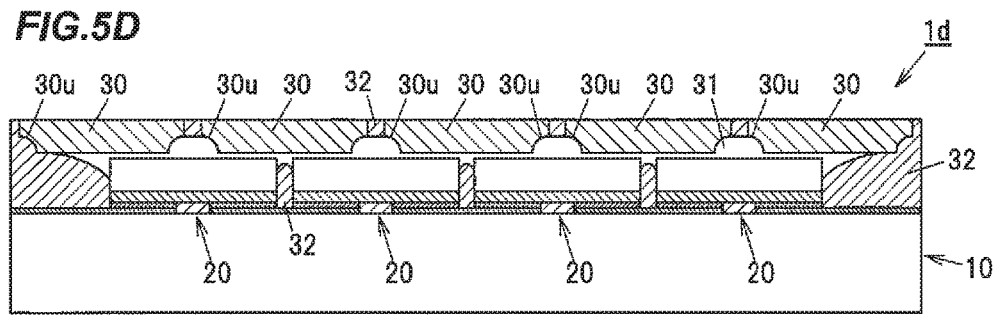
FIG. 5D is a cross sectional view showing a variation of the light emitting device according to the first embodiment.

With respect to the light emitting device 1*d* as shown in FIG. 5D, the arrangement of the light emitting elements 20 and the wavelength conversion members 30 is the same as the light emitting device 1 and the light distribution pattern is nearly the same as the light emitting device 1. However, in the light emitting device 1*d*, an undercut portion 30*u* is formed at an outer peripheral end of a bottom of the wavelength conversion member 30. The shape of the undercut portion 30*u* is not specifically limited and may be an arc in cross section.

Since the wavelength conversion member 30 is provided with the undercut portion 30*u*, adhesive 31 overflowing from a space between the light emitting element 20 and the wavelength conversion member 30 can be filled inside the undercut portion 30*u*. Thus, the adhesive 31 can be prevented from covering near an upper end of the side surface of the light emitting element 20 even if the adhesive 31 overflows. If the adhesive 31 covers near the upper end of the side surface of the light emitting element 20, primary light (i.e., light that fails to pass through the wavelength conversion member 30) of the light emitting element 20 may be output directly to cause an unevenness in color.

If the adhesive 31 enters into the undercut portion 30*u*, the wavelength conversion member 30 can be strongly adhered to the light emitting element 20 as compared to the case that no undercut portion 30*u* is formed.

(Second Embodiment)

The second embodiment is different from the first embodiment in the arrangement of the light emitting elements 20 and the wavelength conversion members 30. Meanwhile, the explanation of the same parts as the first embodiment is omitted or simplified below.

FIG. 6 is a top view showing arrangements of the light emitting element 20 and the wavelength conversion member 30 of the light emitting device 2. In FIG. 6, parts or members other than the light emitting element 20 and the wavelength conversion member 30 are omitted.

In the light emitting device 2, plural light emitting elements 20 are arranged above lattice points of a quadrangle grid (or in a matrix). One wavelength conversion member 30 is placed across among the four light emitting elements 20, of the plural light emitting elements 20, arranged above a unit lattice of the quadrangle grid. Also, each of the plural wavelength conversion members 30 is arranged above the four or more light emitting elements. In other words, none of the wavelength conversion members 30 is placed across the five or more light emitting elements 20.

In the light emitting device 2, the plural wavelength conversion members 30 are arranged separated at intervals from each other. At least a part of the plural wavelength conversion members 30 is placed across the two or more light emitting elements 20 of the plural light emitting elements 20. At least one of the emission intensity of the plural light emitting elements 20 and the conversion efficiency of the plural wavelength conversion members 30 is uneven.

Accordingly, as with the light emitting device 1 of the first embodiment, the light emitting device 2 can have a light distribution pattern different from the light distribution pattern of the light emitting elements 20.

(Third Embodiment)

The third embodiment is different from the first embodiment in that the light emitting element 20 has a groove on the upper surface. Meanwhile, the explanation of the same parts as the first embodiment is omitted or simplified below.

FIG. 7 is a cross sectional view showing the light emitting device 3 of the third embodiment. In the light emitting device 3, plural light emitting elements 20 each have the groove 21*a* directly below a gap between the two wavelength conversion members 30. The groove 21*a* is formed on the element substrate 21 of the light emitting element 20. The groove 21*a* does not affect any functions of a light emitting functional layer 22.

By forming the groove 21*a*, with respect to one light emitting element 20 with the two wavelength conversion members 30 mounted thereon, light entering into one of the wavelength conversion members 30 can be effectively separated from light entering into another of the wavelength conversion members 30. Thus, the intensity distribution of a light distribution pattern can be more clearly defined. Thus is effective for forming the hot zone etc.

As shown in FIG. 7, it is preferred to fill the reflective material 32 into the groove 21*a* so as to effectively separate light in the light emitting element 20. One example of a manufacturing process of the light emitting device 3 will be described below.

Figure 8A:
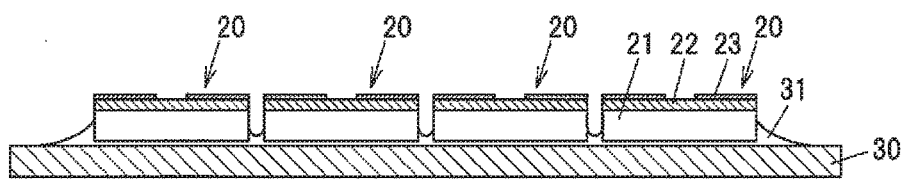
FIG. 8A is a cross sectional view showing a manufacturing process of the light emitting device according to the third embodiment.
Figure 8B:
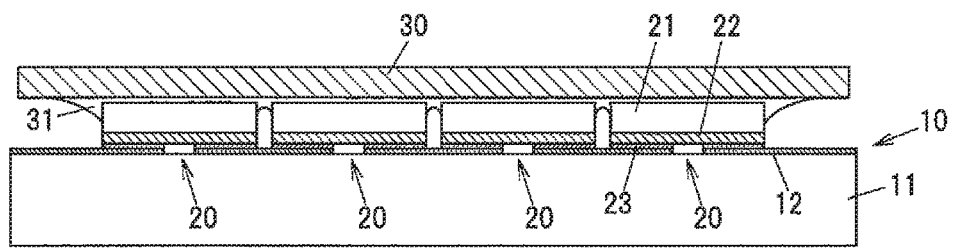
FIG. 8B is a cross sectional view showing a manufacturing process of the light emitting device according to the third embodiment.
Figure 8C:
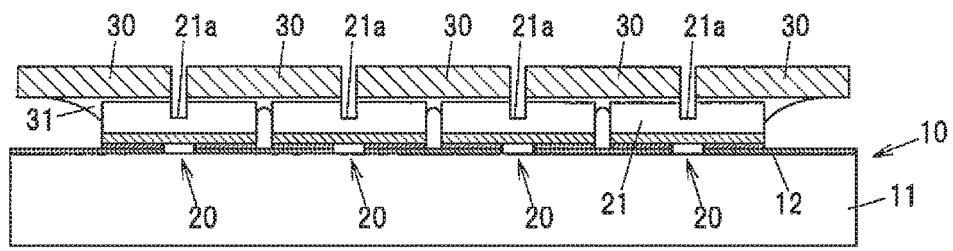
FIG. 8C is a cross sectional view showing a manufacturing process of the light emitting device according to the third embodiment.

FIGS. 8A to 8C are cross sectional views showing a manufacturing process of the light emitting device 3 of the third embodiment.

Firstly, as shown in FIG. 8A, the plural light emitting elements 20 are adhered to one-sheet large wavelength conversion member 30 by the adhesive 31 such that the element substrate 21 faces a bottom side (wavelength conversion member 30 side).

Next, as shown in FIG. 8B, the plural light emitting elements 20 the one-sheet large wavelength conversion member 30 attached thereon is mounted on the wiring substrate 10. Hereby, the element electrodes 23 of the light emitting element 20 are electrically connected to the wirings 12 of the wiring substrate 10.

Next, as shown in FIG. 8C, the wavelength conversion member 30 is cut from above by a dicing blade etc. And the groove 21*a* is formed in the light emitting element 20 by cutting down continuously.

Next, the reflective material 32 is formed so as to cover the side surfaces of the wavelength conversion member 30 and the light emitting element 20.

(Effects of the Embodiments)

According to the abovementioned first to third embodiments of the invention, the light emitting device can be provided that can control the light distribution pattern by size, number, and arrangement of the wavelength conversion member without depending on only the light distribution pattern of the light emitting element.

Also, the hot zone can be formed at a predetermined position (i.e., the center) of the light distribution pattern without depending on the number and arrangement of the light emitting element.

Although the embodiments of the invention have been described, the invention is not to be limited to the abovementioned embodiment. The invention can be appropriately modified and implemented without departing from the gist thereof. The invention can optionally modify elements of the above-mentioned embodiment without departing from the gist thereof.

The invention according to claims is not to be limited to the above-mentioned embodiment. It should be noted that all combinations of the features described in the embodiments are not necessary to solve the problem of the invention.

What is claimed is:

1. A light emitting device, comprising:
plural light emitting elements; and
plural plate-shaped wavelength conversion members that are arranged above the plural light emitting elements and separated from each other, wherein
at least a part of the plural wavelength conversion members is placed across and above two or more light emitting elements of the plural light emitting elements, and
at least one of emission intensity of the plural light emitting elements and conversion efficiency of the plural wavelength conversion members is uneven,
the plural light emitting elements are arranged in line,
one of the plural wavelength conversion members is placed across two adjacent light emitting elements of the plural light emitting elements,
each of the plural wavelength conversion members is arranged above two or fewer light emitting elements of the plural light emitting elements,
the number of the plural light emitting elements is even, and
emission intensity of two central light emitting elements of the plural light emitting elements is higher than emission intensity of another light emitting element.

2. The light emitting device according to claim 1, wherein an outer one of the plural wavelength conversion members has a narrower width than a central one of the plural wavelength conversion members.

3. The light emitting device according to claim 1, wherein one of the plural wavelength conversion members has an undercut portion at an outer peripheral thereof.

4. A light emitting device, comprising:
plural light emitting elements; and
plural plate-shaped wavelength conversion members that are arranged above the plural light emitting elements and separated from each other, wherein
at least a part of the plural wavelength conversion members is placed across and above two or more light emitting elements of the plural light emitting elements, and
at least one of emission intensity of the plural light emitting elements and conversion efficiency of the plural wavelength conversion members is uneven,
the plural light emitting elements are arranged in line,
one of the plural wavelength conversion members is placed across two adjacent light emitting elements of the plural light emitting elements,
each of the plural wavelength conversion members is arranged above two or fewer light emitting elements of the plural light emitting elements,
the number of the plural light emitting elements is even, and
conversion efficiency of a central wavelength conversion member of the plural wavelength conversion members is higher than conversion efficiency of another wavelength conversion member.

5. The light emitting device according to claim 4, wherein an outer one of the plural wavelength conversion members has a narrower width than a central one of the plural wavelength conversion members.

6. The light emitting device according to claim 4, wherein one of the plural wavelength conversion members has an undercut portion at an outer peripheral thereof.

7. A light emitting device, comprising:
plural light emitting elements; and
plural plate-shaped wavelength conversion members that are arranged above the plural light emitting elements and separated from each other, wherein
at least a part of the plural wavelength conversion members is placed across and above two or more light emitting elements of the plural light emitting elements,
at least one of emission intensity of the plural light emitting elements and conversion efficiency of the plural wavelength conversion members is uneven,
the plural light emitting elements are arranged above lattice points of a quadrangle grid,
one of the plural wavelength conversion members is placed across and between four light emitting elements of the plural light emitting elements, which are arranged above a unit lattice of a quadrangle grid,
the plural wavelength conversion members are each arranged above four or fewer light emitting elements of the plural light emitting elements,
the number of the plural light emitting elements is even, and
emission intensity of four central light emitting elements of the plural light emitting elements is higher than emission intensity of another light emitting elements.

8. A light emitting device, comprising:
plural light emitting elements; and
plural plate-shaped wavelength conversion members that are arranged above the plural light emitting elements and separated from each other, wherein
at least a part of the plural wavelength conversion members is placed across and above two or more light emitting elements of the plural light emitting elements, and
at least one of emission intensity of the plural light emitting elements and conversion efficiency of the plural wavelength conversion members is uneven,
the plural light emitting elements are arranged above lattice points of a quadrangle grid,
one of the plural wavelength conversion members is placed across and between four light emitting elements of the plural light emitting elements, which are arranged above a unit lattice of a quadrangle grid,
the plural wavelength conversion members are each arranged above four or fewer light emitting elements of the plural light emitting elements,
the number of the plural light emitting elements is even, and
conversion efficiency of a central wavelength conversion member of the plural wavelength conversion members is higher than conversion efficiency of another wavelength conversion member.

* * * * *